(12) United States Patent
Teramoto et al.

(10) Patent No.: US 11,404,501 B2
(45) Date of Patent: Aug. 2, 2022

(54) DISPLAY UNIT AND ELECTRONIC APPARATUS

(71) Applicant: JOLED INC., Tokyo (JP)

(72) Inventors: Kazuma Teramoto, Tokyo (JP); Jiro Yamada, Tokyo (JP); Kenichi Nendai, Tokyo (JP); Kaoru Abe, Tokyo (JP); Hideki Kobayashi, Tokyo (JP)

(73) Assignee: JOLED INC., Tokyo (JP)

( * ) Notice: Subject to any disclaimer, the term of this patent is extended or adjusted under 35 U.S.C. 154(b) by 142 days.

(21) Appl. No.: 16/303,128

(22) PCT Filed: Apr. 20, 2017

(86) PCT No.: PCT/JP2017/015898
§ 371 (c)(1),
(2) Date: Nov. 19, 2018

(87) PCT Pub. No.: WO2017/208660
PCT Pub. Date: Dec. 7, 2017

(65) Prior Publication Data
US 2020/0161390 A1 May 21, 2020

(30) Foreign Application Priority Data
May 30, 2016 (JP) .............................. JP2016-107097

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3211* (2013.01); *H01L 51/5271* (2013.01); *G09G 3/3233* (2013.01); *G09G 3/3266* (2013.01)

(58) Field of Classification Search
CPC ............ H01L 27/3246; H01L 27/3295; H01L 27/326
See application file for complete search history.

(56) References Cited

U.S. PATENT DOCUMENTS

2004/0119066 A1    6/2004  Han et al.
2005/0285509 A1*  12/2005  Funamoto ........... H01L 51/5275
                                                  313/504
(Continued)

FOREIGN PATENT DOCUMENTS

JP    2007-234232 A    9/2007
JP    2008-91070 A     4/2008
(Continued)

OTHER PUBLICATIONS

Office Action in JP Application No. 2018-520712, dated Apr. 9, 2019 9pp.
(Continued)

*Primary Examiner* — Jesse Y Miyoshi
(74) *Attorney, Agent, or Firm* — Hauptman Ham, LLP

(57) ABSTRACT

A display unit is provided with a plurality of pixels that are two-dimensionally arranged and each include an organic electroluminescence element emitting light of one of a plurality of colors. The pixels are arranged along one direction for each of light emission colors. The pixels each include a first insulating film, a second insulating film, and an organic layer. The first insulating film has openings for the respective pixels. The second insulating film extends along the arrangement direction for each of the light emission colors, in a region between pixels of different light emission colors, out of the plurality of pixels, on the first insulating film. The organic layer is formed in each of the openings, and includes a light-emitting layer. The first insulating film includes a recess that connects together the openings of pixels of the same light emission color, out of the plurality of pixels.

15 Claims, 11 Drawing Sheets

(51) Int. Cl.
*G09G 3/3233* (2016.01)
*G09G 3/3266* (2016.01)

(56) References Cited

U.S. PATENT DOCUMENTS

| | | |
|---|---|---|
| 2006/0028124 A1 | 2/2006 | Chu et al. |
| 2007/0200488 A1 | 8/2007 | Ito |
| 2009/0153044 A1 | 6/2009 | Yanagihara |
| 2009/0160322 A1* | 6/2009 | Yoshida .............. H01L 27/3246 313/504 |
| 2011/0187267 A1 | 8/2011 | Yamamoto et al. |
| 2013/0214301 A1 | 8/2013 | Yamada et al. |
| 2014/0070175 A1 | 3/2014 | Kang |
| 2016/0315125 A1 | 10/2016 | Kikuchi et al. |
| 2016/0359112 A1* | 12/2016 | Wang .................. H01L 27/3246 |
| 2017/0069694 A1 | 3/2017 | Ajiki et al. |

FOREIGN PATENT DOCUMENTS

| | | |
|---|---|---|
| JP | 2009-122278 A | 6/2009 |
| JP | 2009-146848 A | 7/2009 |
| JP | 2009-288735 A | 12/2009 |
| JP | 2011-34849 A | 2/2011 |
| JP | 2013-89293 A | 5/2013 |
| JP | 2013-191533 A | 9/2013 |
| JP | 2015-144087 A | 8/2015 |
| WO | 2010/032514 A1 | 3/2010 |
| WO | 2015/136579 A1 | 9/2015 |

OTHER PUBLICATIONS

International Search Report in PCT/JP2017/015898, dated Jul. 4, 2017. 6pp.

* cited by examiner

DISPLAY UNIT AND ELECTRONIC APPARATUS

RELATED APPLICATIONS

The present application is National Phase of International Application Number PCT/JP2017/015898, filed Apr. 20, 2017, and claims priority based on Japanese Patent Application No. 2016-107097, filed May 30, 2016.

TECHNICAL FIELD

The disclosure relates to a display unit and an electronic apparatus which use an organic electroluminescence (EL) element that emits light by means of an organic electroluminescence phenomenon.

BACKGROUND ART

There has been proposed, for a display unit (an organic EL display) using an organic electroluminescence element, a technique of patterning an organic layer of each pixel using a wet process such as a printing method (refer to PTLs 1 and 2, for example).

CITATION LIST

Patent Literature

PTL 1: Japanese Unexamined Patent Application Publication No. 2013-191533
PTL 2: Japanese Unexamined Patent Application Publication No. 2013-089293

SUMMARY

A display unit in which an organic layer is formed by means of a wet process includes an insulating film referred to as a partition wall that separates pixels from one another. This makes it possible to pattern an organic layer of each of light emission colors by dropping ink for each of the pixels.

It is difficult, however, to form an organic layer uniformly for each of the pixels in a case of using the wet process. As a result, there occurs variation in luminance within a display surface, thus lowering display image quality.

It is desirable to provide a display unit and an electronic apparatus that make it possible to reduce unevenness in luminance and thus to improve display image quality.

A display unit according to an embodiment of the disclosure is provided with a plurality of pixels that are two-dimensionally arranged and each include an organic electroluminescence element emitting light of one of a plurality of colors. The pixels are arranged along one direction for each of light emission colors. The pixels each include a first insulating film, a second insulating film, and an organic layer. The first insulating film has openings for the respective pixels. The second insulating film extends along the arrangement direction for each of the light emission colors, in a region between pixels of different light emission colors, out of the plurality of pixels, on the first insulating film. The organic layer is formed in each of the openings, and includes a light-emitting layer. The first insulating film includes a recess that connects together the openings of pixels of the same light emission color, out of the plurality of pixels.

An electronic apparatus according to an embodiment of the disclosure includes the display unit according to an embodiment of the disclosure.

An electronic apparatus according to an embodiment of the disclosure includes a display unit. The display unit is provided with a plurality of pixels that are two-dimensionally arranged and each include a light-emitting element emitting light of one of a plurality of colors. The pixels are arranged along one direction for each of light emission colors. The pixels each include a first insulating film, a second insulating film, and a light-emitting layer. The first insulating film has openings for the respective pixels. The second insulating film extends along the arrangement direction for each of the light emission colors, in a region between pixels of different light emission colors, out of the plurality of pixels, on the first insulating film. The light-emitting layer is formed in each of the openings. The first insulating film includes a recess that connects together the openings of pixels of the same light emission color, out of the plurality of pixels.

In the display unit and the electronic apparatus according to respective embodiments of the disclosure, the first insulating film having openings for the respective pixels includes the recess that connects together the openings of pixels of the same light emission color, and the organic layer is formed in each of such openings. The second insulating film is formed in a region between pixels of different light emission colors on the first insulating film, and extends along the arrangement direction for each of the light emission colors. This suppresses spreading of ink between the pixels of different light emission colors, while allowing ink to spread uniformly to each of the openings through the recess, between the pixels of the same light emission color, in a case where the organic layer is formed using, for example, a wet process such as printing.

In the display unit and the electronic apparatus according to respective embodiments of the disclosure, the first insulating film having openings for the respective pixels includes the recess that connects together the openings of pixels of the same light emission color, and the organic layer is formed in each of such openings. The second insulating film is formed in a region between pixels of different light emission colors on the first insulating film, and extends along the arrangement direction for each of the light emission colors. This suppresses spreading of ink between the pixels of different light emission colors, while allowing ink to spread uniformly to each of the openings of the same light emission color through the recess, in a case where the organic layer is formed using, for example, a wet process such as printing, thus making it possible to reduce uneven film thickness of the organic layer caused by a film-forming process. Hence, it becomes possible to reduce unevenness in luminance and thus to improve display image quality.

Note that the above description refers to examples of the disclosure. Effects of the disclosure are not limited to the effects described above, and may be any other effects or may further include any other effects.

MODES FOR CARRYING OUT THE INVENTION

In the following, some embodiments of the disclosure are described in detail with reference to the drawings. Note that description is given in the following order.
1. Embodiment (An example in which a recess that connects openings together is provided in a region, of a first insulating film, between pixels of the same color)
2. Application Example (An example of an electronic apparatus)

Embodiment

[Configuration]

Figure 1:
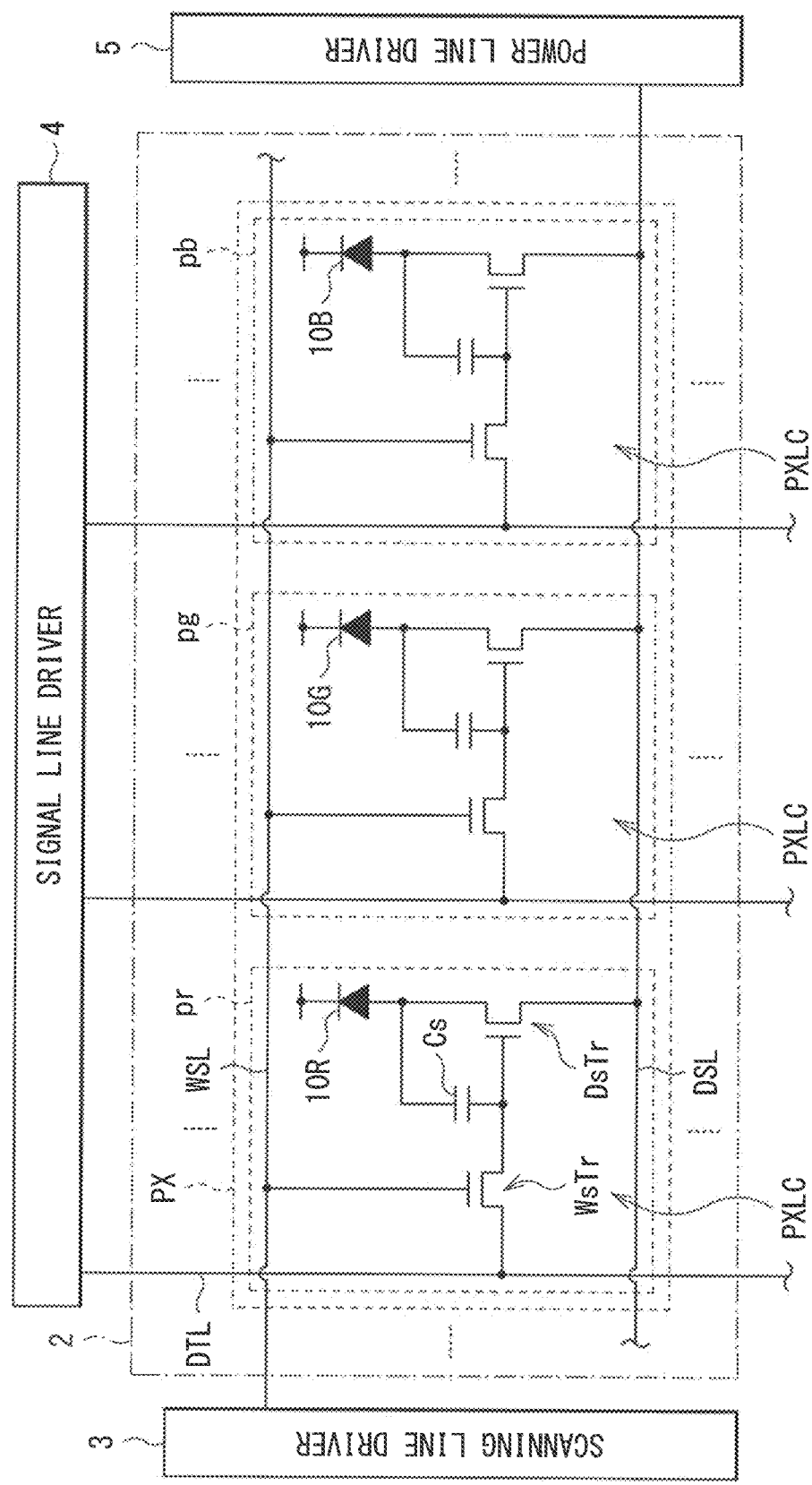
FIG. 1 is a block diagram illustrating an overall configuration of a display unit according to one embodiment of the disclosure.

FIG. 1 is a block diagram illustrating an overall configuration of a display unit (a display unit 1) according to one embodiment of the disclosure. The display unit 1 may be, for example, an organic EL display including an organic electroluminescence element. The display unit 1 may be a top emission display unit which outputs, for example, light of any of R (red), G (green), and B (blue) from top face side.

The display unit 1 may include a pixel section 2 and a circuit section (a scanning line driver 3, a signal line driver 4, and a power line driver 5) that drives the pixel section 2. The pixel section 2 may include a plurality of pixels (pixels pr, pg, and pb) that are two-dimensionally arranged.

The pixel section 2 may display an image, by means of an active matrix scheme, for example, on the basis of an image signal inputted from an external device. There may be provided, in the pixel section 2, a plurality of scanning lines WSL each extending in a row direction of pixel arrangement, a plurality of signal lines DTL each extending in a column direction, and a plurality of power lines DSL each extending in the row direction. The scanning lines WSL, the signal lines DTL, and the power lines DSL may be electrically coupled to each of the pixels pr, pg, and pb. The pixels pr, pg, and pb may each correspond to a subpixel, for example. A set of the pixels pr, pg, and pb may configure one pixel (a pixel PX).

The pixel pr may include an organic EL element 10R that outputs red light, for example. The pixel pg may include an organic EL element 10G that outputs green light, for example. The pixel pb may include an organic EL element 10B that outputs blue light, for example. Hereinafter, the pixels pr, pg, and pb are each referred to as a "pixel P" for description in a case where no particular distinction is necessary. Further, the organic EL elements 10R, 10G, and 10B are each referred to as an "organic EL element 10" for description in a case where no particular distinction is necessary.

The scanning line WSL may supply a selection pulse to each of the pixels P. The selection pulse may be used to select, on a row basis, a plurality of pixels P arranged in the pixel section 2. The scanning line WSL may be coupled to an unillustrated output end of the scanning line driver 3 and to a gate electrode of a switching transistor WsTr described later. The signal line DTL may supply, to each of the pixels P, a signal pulse (a signal electric potential Vsig and a reference electric potential Vofs) based on the image signal. The signal line DTL may be coupled to an unillustrated output end of the signal line driver 4 and to a source electrode or a drain electrode of the switching transistor WsTr described later. The power line DSL may supply, to each of the pixels P, a fixed electric potential (Vcc) as power. The power line DSL may be coupled to an unillustrated output end of the power line driver 5 and to a source electrode or a drain electrode of a driving transistor DsTr described later. Note that the organic EL element 10 has a cathode (a second electrode 16 described later) that may be coupled to a common electric potential line (a cathode line).

The scanning line driver 3 may output a predetermined selection pulse to each of the scanning lines WSL line-sequentially to thereby cause each of the pixels P to execute each of operations such as anode reset, Vth compensation, writing of the signal electric potential Vsig, mobility compensation, and light emission operation, for example, at a predetermined timing. The signal line driver 4 may generate an analog image signal corresponding to a digital image signal inputted from an external device, and may output the generated analog image signal to each of the signal lines DTL. The power line driver 5 may output a fixed electric potential to each of the power lines DSL. The scanning line driver 3, the signal line driver 4, and the power line driver 5 may be controlled to operate in conjunction with one another, on the basis of a timing control signal outputted by an unillustrated timing controller. A digital image signal inputted from the external device may be compensated by an unillustrated image signal receiver. Thereafter, the resultant digital image signal may be inputted to the signal line driver 4.

(Configuration of Pixel Section 2.)

Figure 2:
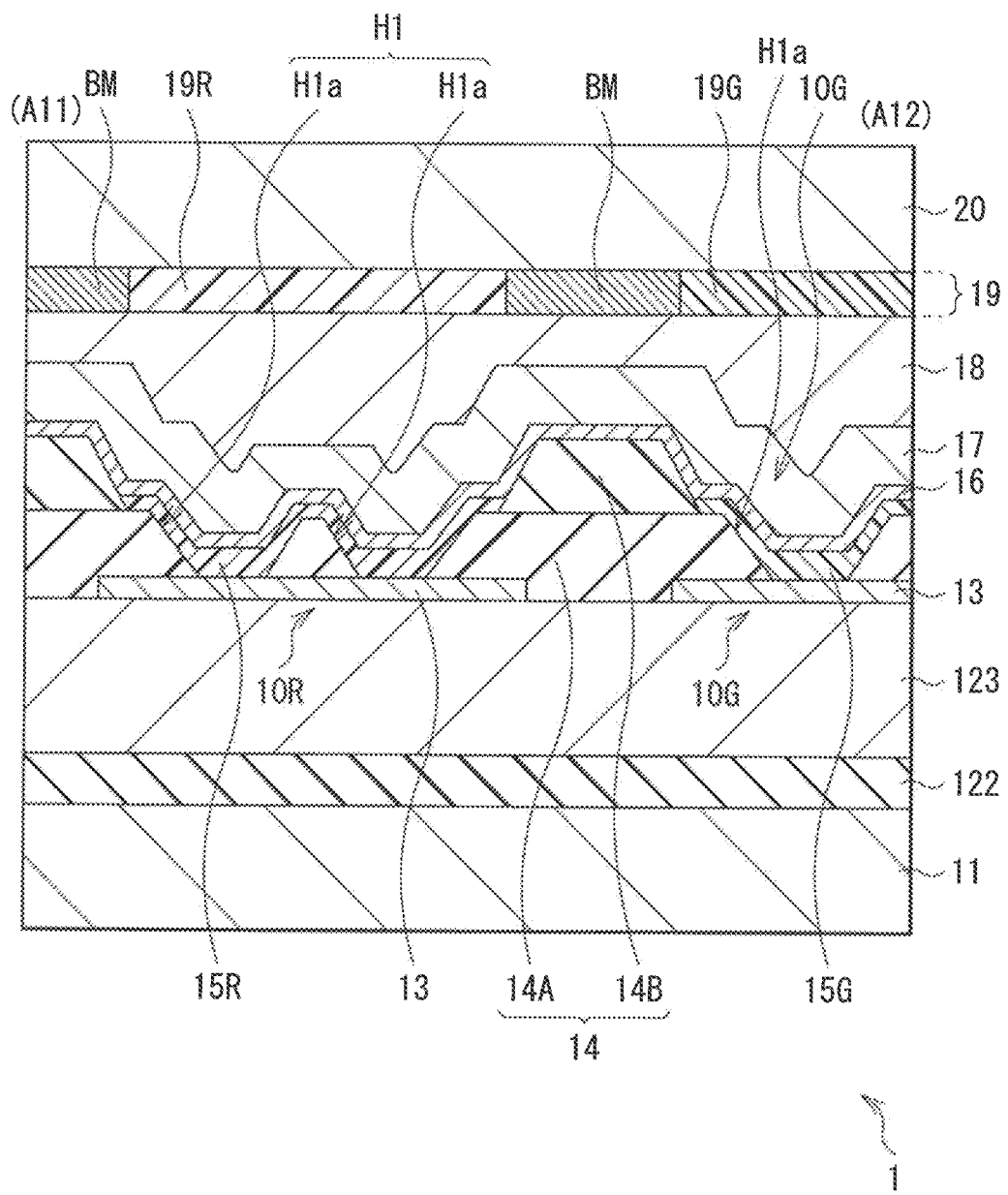
FIG. 2 is a cross-sectional view of a configuration of the display unit (a pixel section) illustrated in FIG. 1.

FIG. 2 illustrates a cross-sectional configuration of the display unit 1 (the pixel section 2). FIG. 2 illustrates only a region corresponding to a portion of the organic EL elements 10R, 10G, and 10B (a portion of the organic electroluminescence element 10R and the organic electroluminescence element 10G). In the pixel section 2, a plurality of organic EL elements 10 are two-dimensionally disposed on a drive substrate 11a. A second substrate 20 may be joined onto the organic EL element 10, with a protective film 17, a sealing layer 18, and a CF/BM layer 19, for example, interposed therebetween.

The drive substrate 11a may include, on a first substrate 11 configured by glass or plastic, for example, an interlayer insulating film 122 and a pixel circuit (a pixel circuit PXLC unillustrated in FIG. 2) that drives each of the organic EL elements 10. A surface of the drive substrate 11a may be planarized by a planarizing film 123.

The pixel circuit PXLC may control light emission and light extinction in the organic EL element 10. The pixel circuit PXLC may include the organic EL element 10 (one of the organic EL elements 10R, 10G, and 10B), a storage capacitor Cs, the switching transistor WsTr, and the driving transistor DsTr, for example.

The switching transistor WsTr may control application of an image signal (a signal voltage) to a gate electrode of the driving transistor DsTr. Specifically, the switching transistor WsTr may sample a voltage (a signal voltage) of the signal line DTL in response to a voltage applied to the scanning line WSL, and may write the signal voltage into the gate electrode of the driving transistor DsTr. The driving transistor DsTr may be coupled in series to the organic EL element 10, and may control a current that flows to the organic EL element 10 in accordance with magnitude of the signal voltage sampled by the switching transistor WsTr. The driving transistor DsTr and the switching transistor WsTr may be each configured by an n-channel MOS or p-channel MOS thin film transistor (TFT), for example. The driving transistor DsTr and the switching transistor WsTr may be each a single-gate transistor or a dual-gate transistor. The storage capacitor Cs may store a predetermined voltage between the gate electrode and the source electrode of the driving transistor DsTr.

The gate electrode of the switching transistor WsTr may be coupled to the scanning line WSL. One electrode of the source electrode and the drain electrode of the switching transistor WsTr may be coupled to the signal line DTL, and the other electrode thereof may be coupled to the gate electrode of the driving transistor DsTr. One electrode of the source electrode and the drain electrode of the driving transistor DsTr may be coupled to the power line DSL, and the other electrode thereof may be coupled to an anode (a first electrode 13 described later) of the organic EL element 10. The storage capacitor Cs may be provided between the gate electrode of the driving transistor DsTr and an electrode on side of the organic EL element 10.

Figure 3:
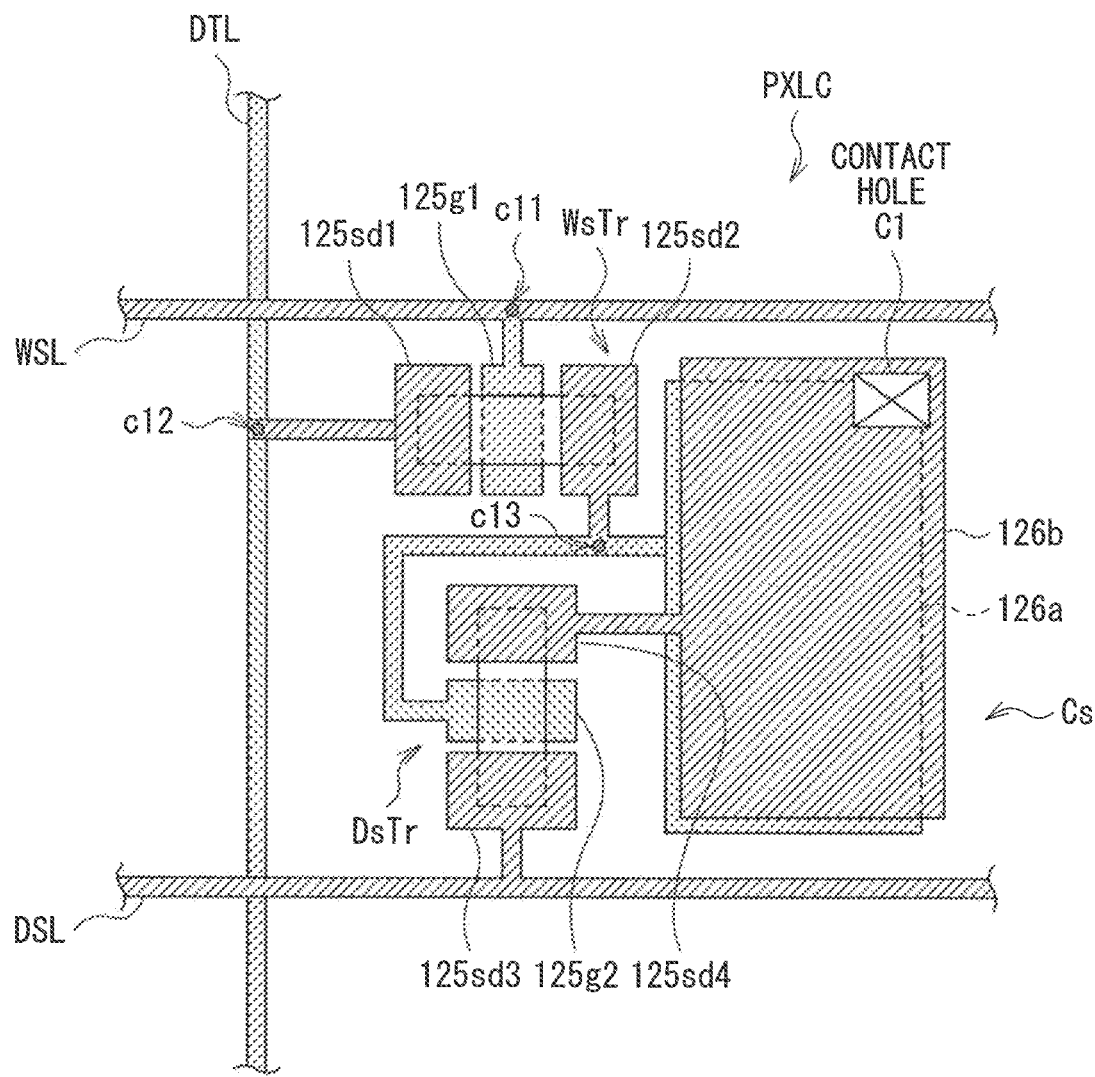
FIG. 3 is a schematic plan view of a configuration of a main part of a pixel circuit.

FIG. 3 illustrates an example of a wiring layout of a main part of the pixel circuit PXLC as described above. The pixel circuit PXLC may be configured by utilizing, for example, a plurality of wiring layers (a first metal layer M1 and a second metal layer M2), a semiconductor layer S1, and interlayer contacts (contact holes c11 to c13) between the first metal layer M1 and the second metal layer M2.

As illustrated in FIG. 3 as an example, a gate electrode 125$g$1 of the switching transistor WsTr, a gate electrode 125$g$2 of the driving transistor DsTr, a lower electrode 126$a$ of the storage capacitor Cs, and the signal line DTL may be disposed in the first metal layer M1. Source-drain electrodes (125$sd$1 and 125$sd$2) of the switching transistor WsTr, source-drain electrodes (125$sd$3 and 125$sd$4) of the driving transistor DsTr, an upper electrode 126$b$ of the storage capacitor Cs, the scanning line WSL, and the power line DSL may be disposed in the second metal layer M2. Among those described above, the gate electrode 125$g$1 of the switching transistor WsTr and the scanning line WSL may be subjected to interlayer coupling through the contact hole c11. The source-drain electrode 125$sd$1 of the switching transistor WsTr may be subjected to interlayer coupling to the signal line DTL through the contact hole c12. The source-drain electrode 125$sd$2 of the switching transistor WsTr may be subjected to interlayer coupling to the lower electrode 126$a$ of the storage capacitor Cs and to the gate electrode 125$g$2 of the driving transistor DsTr through the contact hole c13. The upper electrode 126$b$ of the storage capacitor Cs may be coupled to the anode (the first electrode 13 unillustrated in FIG. 13) of the organic EL element 10 through a contact part C1 (anode contact).

Note that, in this example, a circuit configuration of 2Tr1C is exemplified as the pixel circuit PXLC; however, the configuration of the pixel circuit PXLC is not limited thereto. The pixel circuit PXLC may have a circuit configuration in which components such as various capacitors and transistors are further added to such a 2Tr1C circuit.

Figure 4:
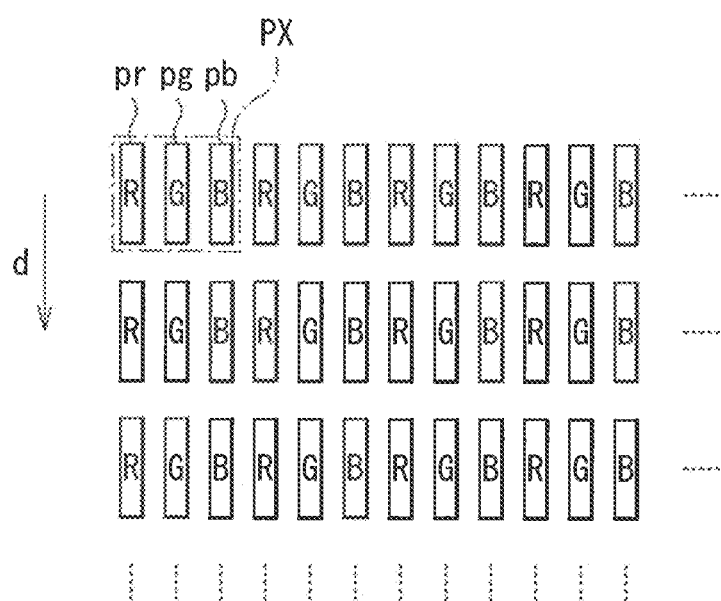
FIG. 4 is a schematic view of an example of pixel arrangement.

The organic EL elements 10R, 10G, and 10B may be provided in a regular arrangement on the drive substrate 11$a$ as described above. FIG. 4 illustrates an example of pixel arrangement (arrangement of the organic EL elements 10). The arrangement of the pixels pr, pg, and pb are not particularly limited. However, in a case of using a wet process such as printing, for example, in a film-forming process of the organic EL element 10, it is desirable that a plurality of pixels pr, pg, and pb be arranged along one direction for each of light emission colors. That is, the pixels pr (organic EL elements 10R) may be arranged in one line along an arrangement direction d; the pixels pg (organic EL elements 10G) may be arranged in one line along the arrangement direction d; and the pixels pb (organic EL elements 10B) may be arranged in one line along the arrangement direction d. The pixels pr, pg, and pb may each have, but not particularly limited to, a rectangular surface shape, for example. The arrangement direction d is along a longitudinal direction of each (rectangular) surface shape of the pixels pr, pg, and pb. In a manufacturing process, for example, ink of each of the light emission colors may be dropped for each of the lines along the arrangement direction d, thus allowing for formation of organic layers 15R, 15G, and 15B.

The organic EL element 10R may include, between the first electrode 13 and the second electrode 16, the organic layer 15R that includes a red light-emitting layer. Likewise, the organic EL element 10G may include, between the first electrode 13 and the second electrode 16, the organic layer 15G that includes a green light-emitting layer. The organic EL element 10B may include, between the first electrode 13 and the second electrode 16, the organic layer 15B that includes a blue light-emitting layer.

The first electrode 13 may serve as an anode, for example, and may be provided for each of the pixels P. Examples of a constituent material of the first electrode 13 may include a simple substance and an alloy of a metal element such as aluminum (Al), chromium (Cr), gold (Au), platinum (Pt), nickel (Ni), copper (Cu), tungsten (W), and silver (Ag). Further, the first electrode 13 may include a stacked film of a metal film and an electrically conductive material having light-transmissivity (a transparent electrically conductive film). The metal film may be made of a simple substance or an alloy of the above-mentioned metal elements. Examples of the transparent electrically conductive film may include indium-tin oxide (ITO), indium-zinc oxide (IZO), tungsten oxide (WO$_x$), and a zinc oxide (ZnO)-based material. Examples of the zinc oxide-based material may include aluminum (Al)-doped zinc oxide (AZO) and gallium (Ga)-doped zinc oxide (GZO).

The organic layers 15R, 15G, and 15B may each generate recombination of electrons and holes through application of an electric field, and may include an organic electroluminescent layer (the red light-emitting layer, the green light-emitting layer, or the blue light-emitting layer) that emits a color beam of one of R, G, and B. Examples of a film-forming method of these organic layers 15R, 15G, and 15B may include wet processes such as a printing method and a coating method. Examples thereof may include an ink-jet printing method and a nozzle coating method. The organic layers 15R, 15G, and 15B may each include, in addition to the organic electroluminescent layer, for example, a hole injection layer, a hole transport layer, and an electron transport layer, as necessary. Further, an electron injection layer may be formed between each of the organic layers 15R, 15G, and 15B and the second electrode 16.

The second electrode 16 may serve as a cathode, for example, and may be formed across the entire surface of the pixel section 2 (i.e., as an electrode common to all of the pixels). The second electrode 16 may be configured by a transparent electrically conductive film, for example. As a material of the transparent electrically conductive film, an oxide material similar to those listed as the material of the above-described first electrode 13 may be used. Although a thickness of the second electrode 16 is not particularly limited, the thickness may be preferably set in consideration of electrical conductivity and light-transmissivity. In addition to these materials, an alloy of magnesium and silver (an Mg—Ag alloy) may also be used for the second electrode 16.

The organic layers 15R, 15G, and 15B of the respective organic EL elements 10R, 10G, and 10B may be each formed in a region (an opening H1) defined by a pixel separation film 14. The pixel separation film 14 may be formed on the first electrode 13, and may have the opening H1 that faces the first electrode 13.

The pixel separation film 14 may define a light-emitting region of each of the pixels P into a desired shape, and may serve to separate organic layers in adjacent pixel columns (i.e., organic layers of different light emission colors) from each other. Further, the pixel separation film 14 may ensure insulation between the first electrode 13 and the second electrode 16. The pixel separation film 14 may include, for example, a first insulating film 14A having the opening H1, and a second insulating film 14B stacked in a predetermined region on the first insulating film 14A.

Figure 5A:
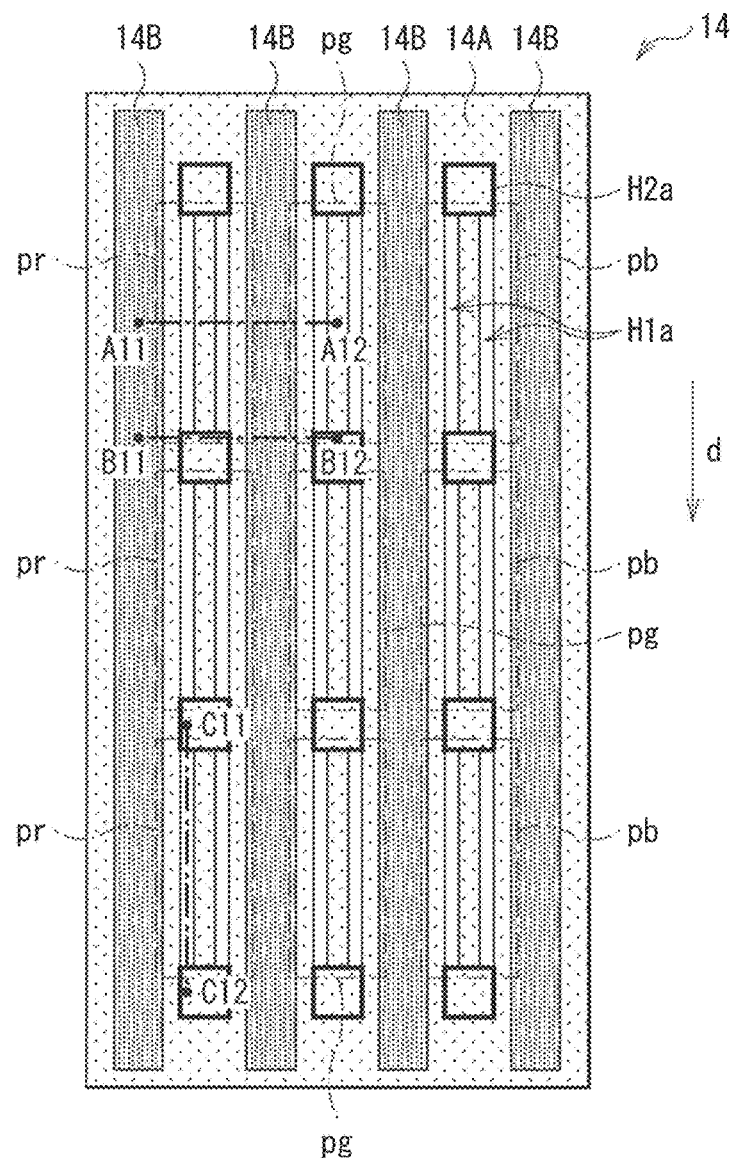
FIG. 5A is a schematic view of a planar configuration of a pixel separation film illustrated in FIG. 2.
Figure 5B:
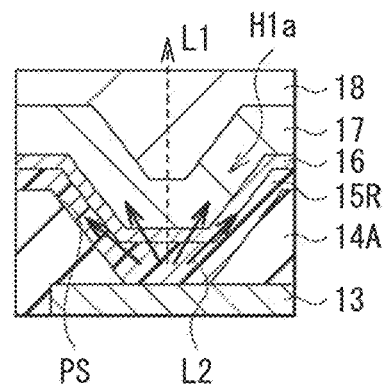
FIG. 5B is an enlarged cross-sectional view of a configuration of a vicinity of an opening illustrated in FIG. 2.

FIG. 5A illustrates a planar configuration (i.e., a configuration of a surface parallel to a surface of the substrate) of the pixel separation film 14. Note that FIG. 5A illustrates, for the sake of simplicity, a configuration in which three pixels pr, three pixels pg, and three pixels pb are each arranged along the arrangement direction d. FIG. 5B is an enlarged view of a vicinity of the opening of the first insulating film 14A in the cross-sectional configuration of FIG. 2. Note that the configuration illustrated in FIG. 2 corresponds to a cross-sectional configuration taken along a line A11-A12 in FIG. 5.

In this manner, the first insulating film 14A may have the opening H1 for each of the pixels P (for each first electrode 13). The opening H1 may include one or a plurality of sub-openings. In this example, the opening H1 may include a reflector (reflective structure), and may be configured by two sub-openings H1a. The sub-openings H1a may each have a rectangular shape extending along the arrangement direction d.

The first insulating film 14A may include, for example, a photosensitive resin such as an acrylic resin, a polyimide resin, a fluorine resin, a silicon resin, a fluorine polymer, a silicon polymer, a novolak resin, an epoxy resin, and a norbornene resin. Alternatively, any of these resin materials with a colorant dispersed therein may also be used. In addition to such organic materials, for example, an inorganic material such as silicon oxide ($SiO_2$), silicon nitride (SiN), and silicon oxynitride (SiON) may also be used for the first insulating film 14A. It is desirable that the first insulating film 14A have lyophilicity (i.e., affinity to ink upon formation of the organic layers 15R, 15G, and 15B). One reason for this is that a wet-spreading property of ink becomes favorable in the organic layers 15R, 15G, and 15B during film-formation, thus making uneven film thickness less likely to occur.

A refractive index of the first insulating film 14A may be set, for example, smaller than a refractive index of each of the protective film 17 and the sealing layer 18 described later. The first insulating film 14A may have a thickness of 1 µm to 10 µm, for example. By properly setting factors such as the thickness and the refractive index of the first insulating film 14A and shapes of the sub-opening H1a (such as a shape and an inclination angle of an inclined surface PS), it becomes possible to cause the opening H1 (the sub-opening H1a) to serve as the so-called reflector (reflective structure).

The organic layer 15R (or the organic layer 15G or 15B; the same hereinafter) may be formed inside the two sub-openings H1a to cover their bottoms. During display-driving, as illustrated in FIG. 5B, light outputted from the organic layer 15R (light-emitting layer) includes, in addition to light traveling in a frontal direction L1, light traveling in a direction L2 shifted from the frontal direction L1 (i.e., light traveling in an oblique direction). The light traveling in the oblique direction L2 is reflected at the inclined surface PS of the sub-opening H1a, and is raised in the frontal direction L1. The reflector included in the opening H1 makes it possible to enhance a light extraction efficiency.

The second insulating film 14B is provided in a region between the pixels P of different light emission colors on the first insulating film 14A (i.e., in a region between the openings H1 disposed in different pixel columns) to extend along the arrangement direction d. For the second insulating film 14B, a material either the same as or different from that of the first insulating film 14A may be used. However, it is desirable that at least an upper surface of the second insulating film 14B have a liquid-repellent property. Accordingly, it is desirable that the second insulating film 14B be subjected to a liquid-repellent treatment after film-formation. One reason for this is that it is possible to suppress the wet-spreading (color mixing) of ink between adjacent pixel columns (i.e., between organic layers of different light emission colors) and thus to enhance a function as a partition wall. The second insulating film 14B may have a thickness of 0.5 µm to 10 µm, for example.

Figure 6A:
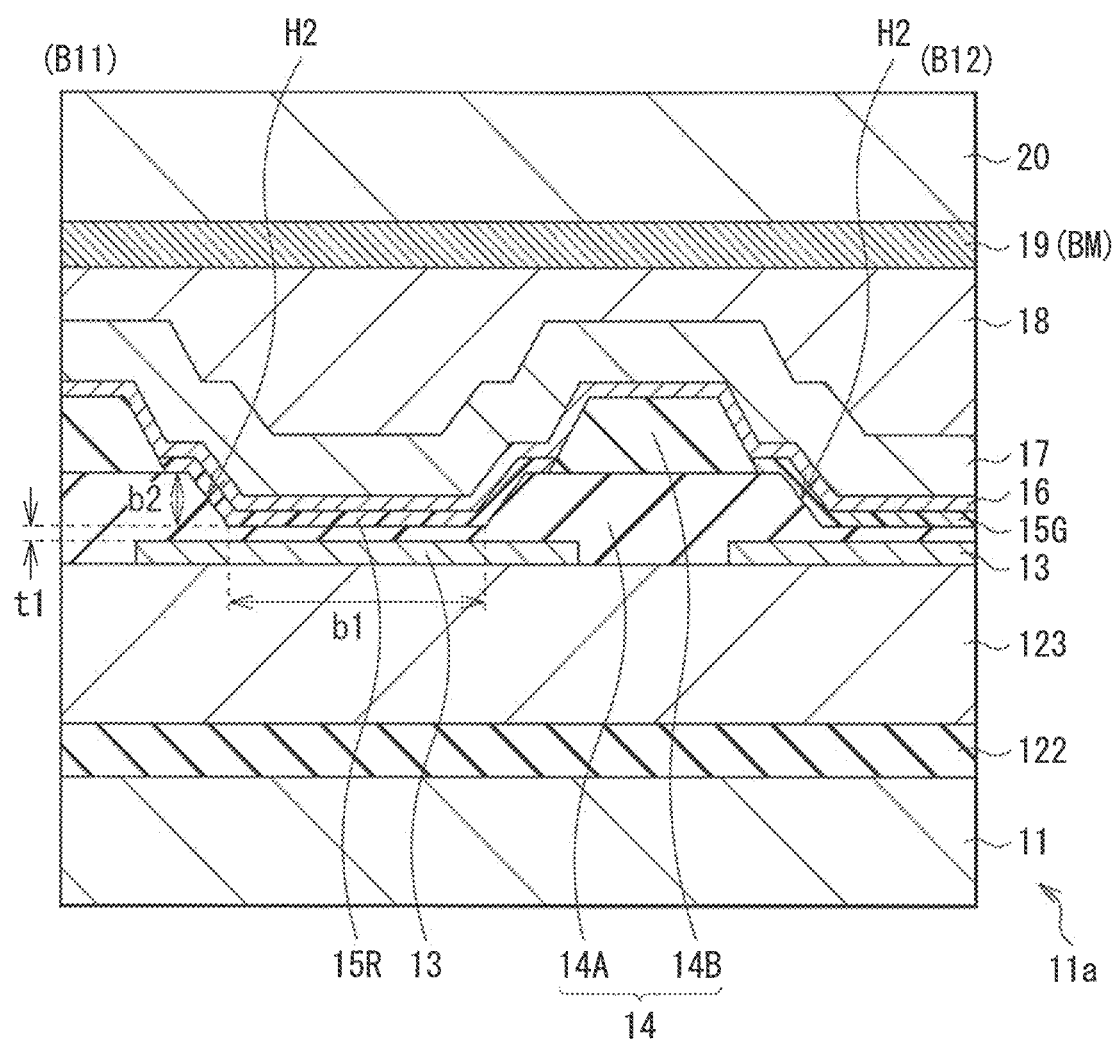
FIG. 6A illustrates a cross-sectional configuration taken along a line B11-B12 illustrated in FIG. 5A.
Figure 6B:
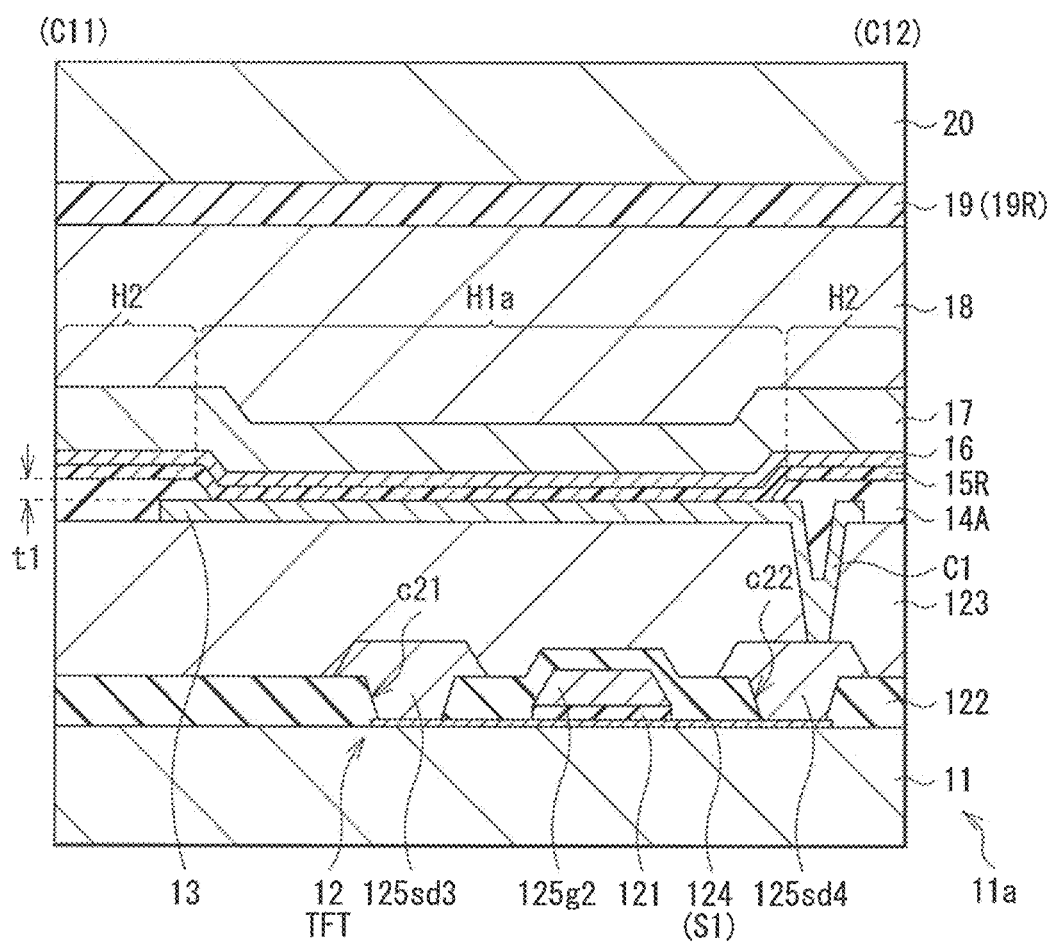
FIG. 6B illustrates a cross-sectional configuration taken along a line C11-C12 illustrated in FIG. 5A.

In the pixel separation film 14 having such a configuration, the first insulating film 14A may have a recess (a recess H2) that connects together the openings H1 of the pixels P of the same light emission colors out of the plurality of pixels P. FIG. 6A illustrates a cross-sectional configuration taken along a line B11-B12 illustrated in FIG. 5A (i.e., a cross-sectional configuration of a region between adjacent pixels Pr and Pg). FIG. 6B illustrates a cross-sectional configuration taken along a line C11-C12 in FIG. 5A. As illustrated in FIG. 5A, each region between pixels pr (or between pixels pg or between pixels pb) adjacent in the arrangement direction d may have the recess H2 (i.e., may be a recess-forming region H2a).

The recess H2 may couple together the openings H1 of the pixels P of the same light emission color (the pixels pr, the pixels pg, or the pixels pb), and may serve as an ink channel of the organic layer (the organic layer 15R, the organic layer 15G, or the organic layer 15B). Note that, although illustration is omitted in FIG. 5A, the sub-openings H1a may be connected together through the recess H2 between adjacent pixels pr. The two sub-openings H1a that configure one opening H1 either may be connected together or may not be connected together in the recess H2. Factors such as a shape, a width b1, and a depth b2 of the recess H2 are not particularly limited. However, as illustrated in FIGS. 6A and 6B, it is desirable that the first insulating film 14A have a thickness (t1) in a bottom of the recess H2, and the thickness t1 may be in a range from 0.1 μm to 2 μm, for example. In other words, it is desirable that ends of the first electrode 13 be configured to be covered with the first insulating film 14A. One reason for this is that it is possible to suppress occurrence of electrical short circuit between the first electrode 13 and the second electrode 16. Further, it is desirable that the thickness t1 of the first insulating film 14A be formed sufficiently smaller than the depth b2. In this example, the organic layer 15R may also be formed inside the recess H2 to cover a surface of the bottom. One reason for this is that the organic layer 15R may be formed by wet-spreading up to an adjacent opening H1 through the recess H2 during the film-formation. However, the bottom surface of the recess H2 may not be necessarily covered with the organic layer 15R. Only a selective region of the bottom surface of the recess H2 may be covered with the organic layer 15R.

Figure 7A:
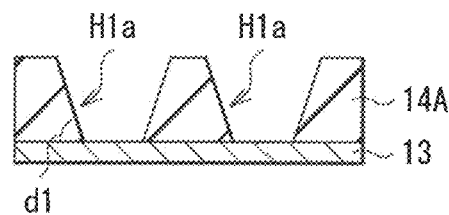
FIG. 7A is a schematic view that describes a taper angle of an opening of a first insulating film.
Figure 7B:
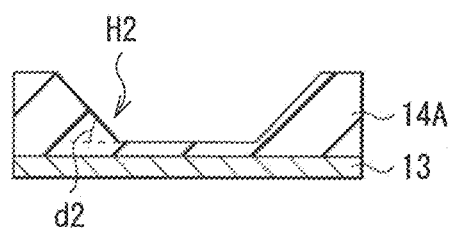
FIG. 7B is a schematic view that describes a taper angle of a recess.

It is desirable that a contact angle on a surface (side surface) of the recess H2 be smaller than a contact angle on the upper surface of the second insulating film 14B. Further, as schematically illustrated in FIGS. 7A and 7B, it is desirable that a taper angle d2 of the side surface of the recess H2 be smaller than a taper angle d1 of a side surface of the sub-opening H1a of the first insulating film 14A (d1>d2). One reason for this is that pinning is relaxed to make ink more likely to undergo wet-spreading more uniformly. In a case where the sub-opening H1a and the recess H2 are formed by means of halftone exposure described later, the taper angles d1 and d2 may have a relation as described above.

Note that FIG. 6B illustrates a TFT 12 in the drive substrate 11a. The TFT 12 corresponds to the driving transistor DsTr illustrated in FIGS. 1 and 3, for example. The TFT 12 may include a semiconductor layer 124 (a portion of the semiconductor layer S1 illustrated in FIG. 3) in a selective region on the first substrate 11, for example, and may include a gate electrode 125g2 on the semiconductor layer 124 with a gate insulating film 121 interposed therebetween. An interlayer insulating film 122 may be formed on the gate electrode 125g2. The source-drain electrodes 125sd3 and 125sd4 may be provided on the interlayer insulating film 122. The source-drain electrodes 125sd3 and 125sd4 may be electrically coupled to the semiconductor layer 124 through, respectively, contact holes c21 and c22 provided in the interlayer insulating film 122. The source-drain electrode 125sd4 may be electrically coupled to the first electrode 13 through the contact part C1.

The pixel separation film 14 as described above may be formed, for example, as follows. That is, a plurality of first electrodes 13 may be first formed on the drive substrate 11a. Thereafter, the first insulating film 14A made of the above-described photosensitive resin, etc. may be formed, for example, by means of a method such as coating in a predetermined thickness to cover the plurality of first electrodes 13. Thereafter, a photo mask may be used to perform exposure, followed by going through processes such as development, washing, and drying, thereby forming the opening H1 (sub-opening H1a) and the recess H2. At this occasion, the first insulating film 14A may be exposed using a halftone mask, for example, to allow a formation region of the sub-opening H1a and the recess-forming region H2a to have different exposure amounts. This makes it possible to form the sub-opening H1a and the recess H2 that have different depths, using one photo mask. Alternatively, a photo mask for formation of the sub-opening H1a and a photo mask for formation of the recess H2 may be each provided to perform exposure in different processes.

Note that, in a case of using, for example, an inorganic material such as a silicon oxide film as the first insulating film 14A, it is possible to form the sub-opening H1a and the recess H2 by performing etching using a photolithography method, for example, after formation of the first insulating film 14A by means of a CVD method, for example.

Thereafter, the second insulating film 14B may be patterned in a predetermined region on the first insulating film 14A. This makes it possible to form the pixel separation film 14 having the above-described configuration. After the formation of the pixel separation film 14, the organic layers 15R, 15G, and 15B may be formed in the respective openings H1, for example, by means of the wet process such as the ink-jet printing method.

The protective film 17 may be configured either by an insulating material or an electrically conductive material. Examples of the insulating material may include inorganic amorphous insulating materials such as amorphous silicon (α-Si), amorphous silicon carbide (α-SiC), amorphous silicon nitride (α-$Si_{1-x}N_x$), and amorphous carbon (α-C). Such an inorganic amorphous insulating material does not configure grain, and thus has low water permeability, allowing the material to serve as a favorable protective film. In addition to those described above, silicon nitride, silicon oxide, and silicon oxynitride may also be used.

The sealing layer 18 may be formed substantially uniformly on the protective film 17, and may serve as an adhesive layer, for example. Examples of a material of the sealing layer 18 may include an acrylic resin, a polyimide resin, a fluorine resin, a silicon resin, a fluorine polymer, a silicon polymer, an epoxy resin, and a norbornene resin.

A refractive index of the material of each of the protective film 17 and the sealing layer 18 may have influence on a light extraction efficiency of the reflective structure, and thus a proper material may be preferably selected in consideration of sealing performance and the light extraction efficiency.

The CF/BM layer 19 may be a layer that includes color filter layers (a red filter 19R, a green filter 19G, and a blue filter 19B) and a black matrix layer BM. The red filter 19R, the green filter 19G, and the blue filter 19B may be each disposed in a region facing the opening H1. These red filter 19R, green filter 19G, and blue filter 19B may be each configured by a resin with a pigment mixed therein. The black matrix layer BM may be configured, for example, by a resin film with a black colorant mixed therein, or by a thin film filter utilizing interference of a thin film. The thin film filter may have a configuration in which, for example, one or more thin films made of a material such as metal, a metal nitride, and a metal oxide are stacked to attenuate light by utilizing the interference of the thin films. Specific examples of the thin film filter may include a filter in which chromium (Cr) and chromium(III) oxide ($Cr_2O_3$) are stacked alternately. Such a CF/BM layer 19 may be disposed as necessary (may not be necessarily disposed). The provision of the CF/BM layer 19, however, makes it possible to extract light generated in the organic EL element 10 and to absorb other stray light as well as external light, and thus to improve a contrast.

The second substrate 20, together with the sealing layer 18, may seal the organic EL element 10. The second substrate 20 may be configured, for example, by a material such as glass or plastic that is transparent to the light generated in the organic EL element 10.

Workings and Effects

In the display unit 1 as described above, a selection pulse may be supplied to the switching transistor WsTr of each of the pixels P from the scanning line driver 3 to select a pixel P. A signal voltage corresponding to an image signal supplied from the signal line driver 4 may be supplied to the selected pixel P, and the supplied signal voltage may be stored in the storage capacitor Cs. The driving transistor DsTr may be subjected to ON/OFF control in response to the signal stored by the storage capacitor Cs, and a drive current may be flowed into the organic EL element 10. This allows for generation of light emission through recombination of holes and electrons in the organic EL element 10 (the organic electroluminescent layer). The light may be extracted by transmission through the second electrode 16, the protective film 17, the sealing layer 18, the CF/BM layer 19, and the second substrate 20, for example. Additive color mixture of the color beams thus outputted from each of the pixels P (the pixels pr, pg, and pb) allows color image display to be performed.

Here, it is desirable that, in the display unit 1 including the organic EL element 10, the wet process such as the printing method be used instead of a dry process such as a vapor-deposition method upon formation of the organic layer 15R (or the organic layer 15G or 15B) including the light-emitting layer. The wet process is able to form an organic layer (light-emitting layer) in the atmosphere, eliminating the need for a vacuum environment and thus to simplify facility maintenance. Further, a shielding mask is unnecessary, and mask replacement for each unit type is also unnecessary. In other words, it is possible to shorten non-operation time of a facility where the organic layer is formed, and thus to improve productivity. Furthermore, in the dry process, a distance between a vapor-deposition source and a substrate is increased with an increase in panel size, thus making it difficult to form the organic layer uniformly. However, the wet process involves no such limitation, thus making it easier to address the increased panel size. In addition, it is possible, in the wet process, to apply only a necessary amount of the organic layer to a necessary location, thus enhancing efficiency in utilizing a material of the organic layer.

Figure 8:
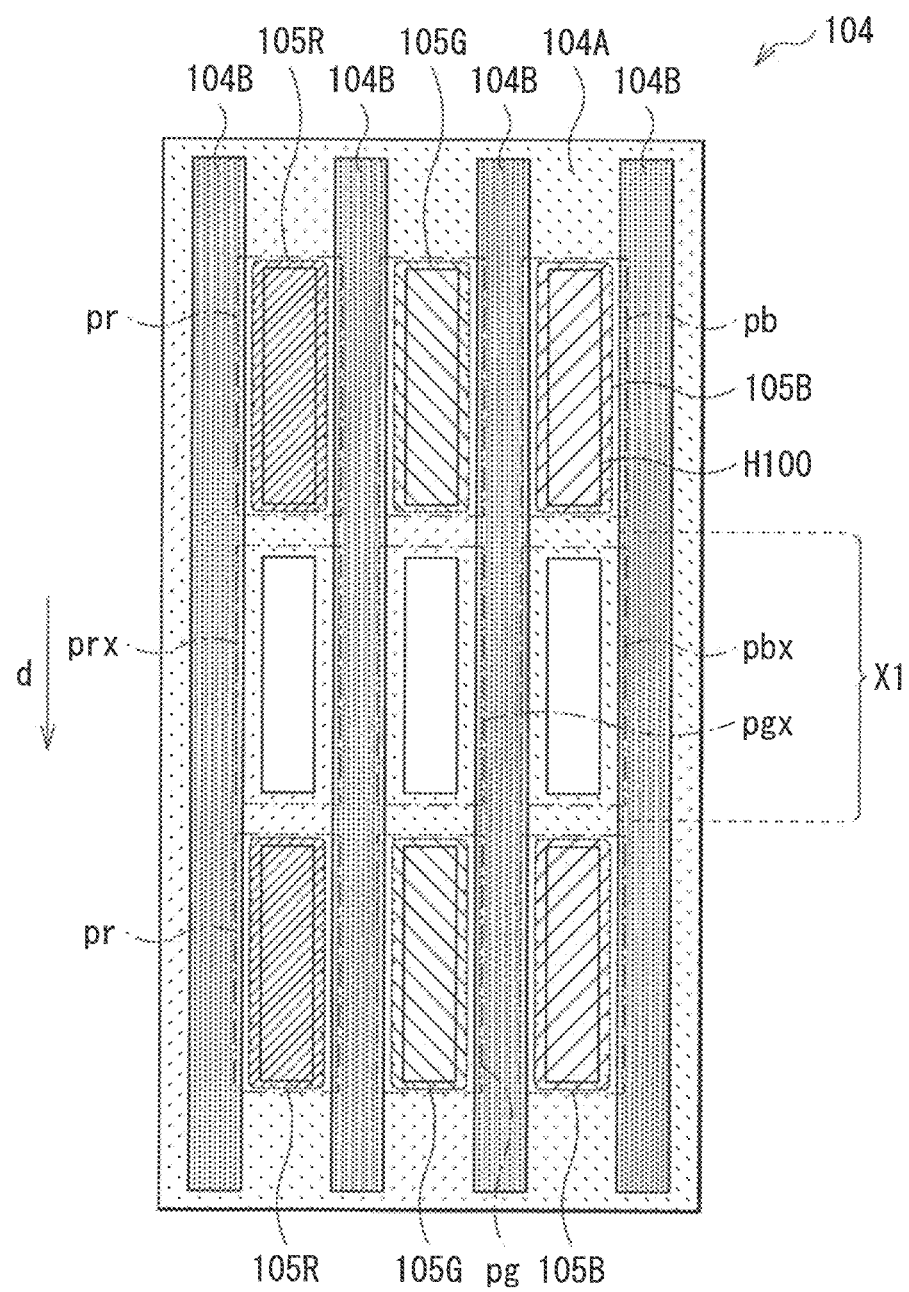
FIG. 8 is a schematic view that describes a configuration of a pixel separation film according to a comparative example.

In a case of using the wet process, a partition wall (pixel separation film) may be provided to suppress the wet-spreading of ink between pixels. FIG. 8 illustrates a planar configuration of a pixel separation film 104 according to a comparative example of the present embodiment. The pixel separation film 104 includes a first insulating film 104A that includes openings H100, and a second insulating film 104B that is stacked in a predetermined region on the first insulating film 104A. The openings H100 each define a shape of a light-emitting region, and are provided for respective pixels. The second insulating film 104B is provided to extend along one direction in a region between the openings H100 on the first insulating film 104A. Note that pixel arrangement in this comparative example is similar to that illustrated in FIG. 4.

In the pixel separation film 104, however, unlike the present embodiment, a thickness of a peripheral part of the opening H100 of the first insulating film 104A is substantially constant, and a region between the pixels pr has a shape without a recess.

In a case of patterning organic layers (organic layers 105R, 105G, and 105B) using the wet process, ink is dropped linearly along the arrangement direction d for each of the pixel columns of R, G, and B. Actually, however, there is a part where ink is not sufficiently dropped, as in a partial pixel row X1 (pixels prx, pgx, and pbx). Such pixels prx, pgx, and pbx have lowered light emission luminance. Otherwise no ink is dropped (i.e., there is a part where no dropping is performed), and thus no light emission is generated. This causes unevenness in luminance within a display screen.

Figure 9:
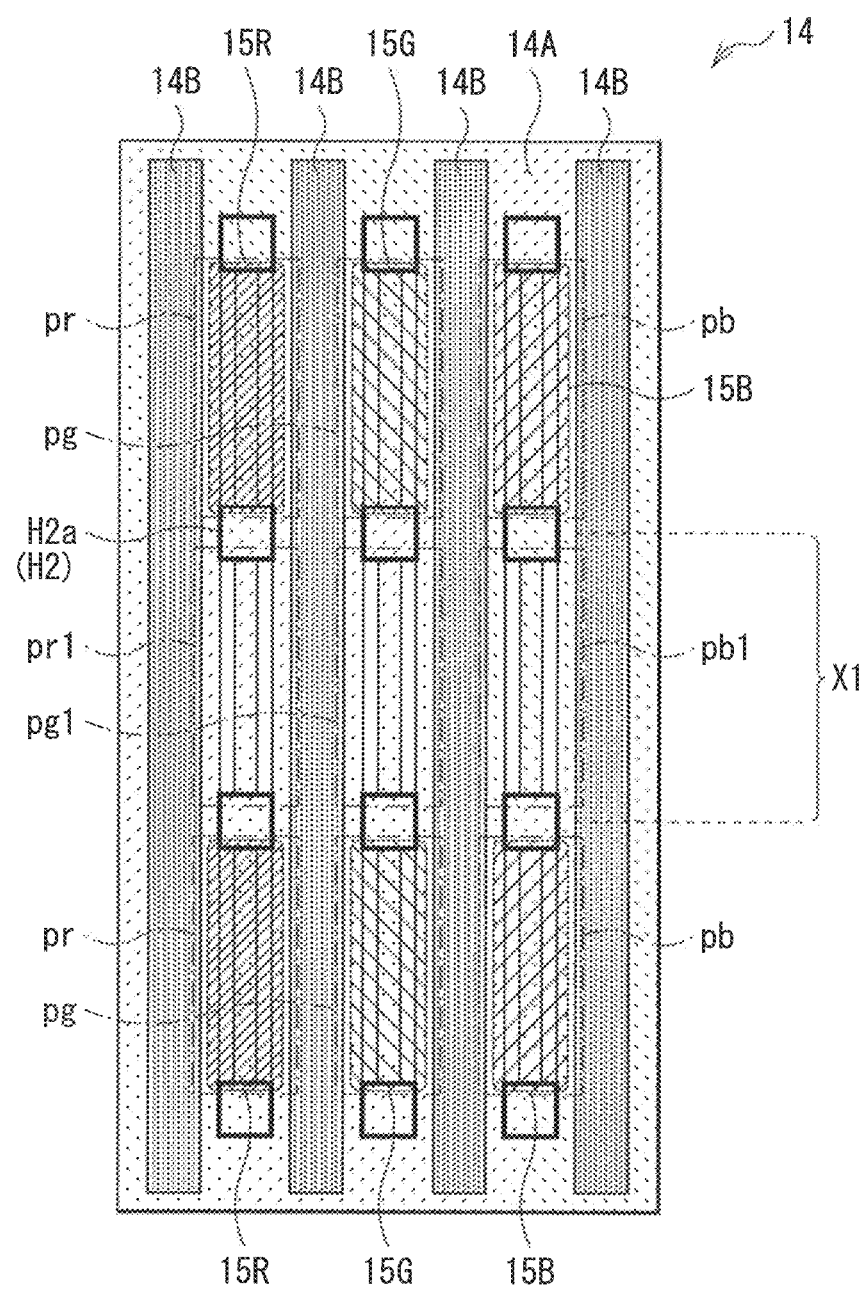
FIG. 9 is a schematic view that describes effects obtained by the pixel separation film illustrated in FIG. 5A.
Figure 10:
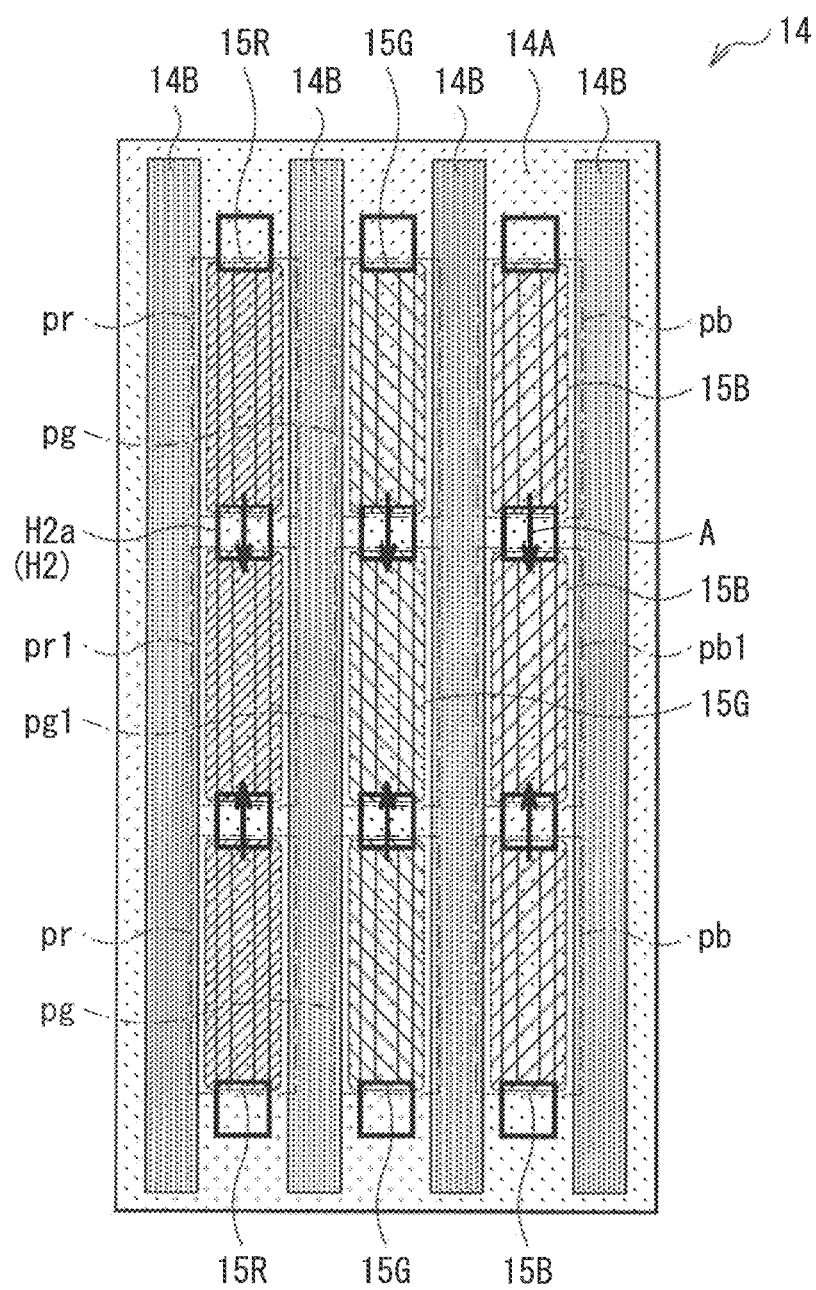
FIG. 10 is a schematic view that describes effects obtained by the pixel separation film illustrated in FIG. 5A.

Meanwhile, in the present embodiment, the first insulating film 14A in the pixel separation film 14 may include the recess H2 that connects together the openings H1 of the pixels of the same light emission color out of the plurality of pixels P. Specifically, the recess H2 may be formed in each of a region between the openings H1 of adjacent pixels pr, a region between the openings H1 of adjacent pixels pg, and a region between the openings H1 of adjacent pixels pb. This allows for the wet-spreading of ink (arrows A in FIG. 10), through respective recesses H2, to a pixel pr1 from its adjacent pixel pr, to a pixel pg1 from its adjacent pixel pg, and to a pixel pH from its adjacent pixel pb, even in a case where the partial pixel row X1 (the pixels pr1, pg1, and pb1) has a part where ink is not sufficiently dropped or a part where no dropping is performed (FIG. 9) immediately after the printing of the organic layers 15R, 15G, and 15B, for example. This allows for formation of the organic layers 15R, 15G, and 15B each in uniform film thickness in each of the pixel columns of the pixels pr, pg, and pb. Hence, it is possible to reduce uneven film thickness of the organic layers 15R, 15G, and 15B caused by a film-forming process.

The effects brought by the recess H2 are particularly effective in a case where the opening H1 has the reflector (reflective structure). In the case where the opening H1 has the reflector, the first insulating film 14A may be designed to allow the material and the thickness of the first insulating film 14A and the shape of the sub-opening H1a, for example, to satisfy various conditions. In this case, the first insulating film 14A may be designed to have a larger thickness than a case where no reflector is formed. Accordingly, the wet-spreading of ink is poor between the pixels of the same light emission color. Thus, the part where ink is not sufficiently dropped or the part where no dropping is performed, that has been generated during the printing process as described above, may remain as it is, thus causing unevenness in luminance in some cases. Connecting the openings H1 together using the recess H2 as in the present embodiment makes it possible to perform film-formation without inhibiting the wet-spreading of ink even in a case where the first insulating film 14A is designed to have a relatively large film thickness. In other words, it is possible to reduce unevenness in luminance caused by the wet process while enhancing a light extraction efficiency of the organic EL element 10, thus allowing for achievement of a display having higher image quality.

As described above, in the present embodiment, the first insulating film 14A including the opening H1 for each of the pixels P may include the recess H2 that connects together the openings H1 of the pixels P of the same light emission color (the pixels Pr, the pixels pg, or the pixels pb). The organic layers 15R, 15G, and 15B may be formed in such openings H1. Further, the second insulating film 14B extending along the arrangement direction for each light emission color may be formed in a region between the pixels P of different light emission colors on the first insulating film 14A. This suppresses the spreading of ink between the pixels P of different light emission colors while allowing uniform wet-spreading of ink in the openings H1 of the same light emission color through the recess H2 in the case of forming the organic layers 15R, 15G, and 15B using, for example, the wert process such as the printing, thus making it possible to reduce uneven film thickness of each of the organic layers 15R, 15G, and 15B. Hence, it becomes possible to enhance display image quality.

Application Example

Figure 11:
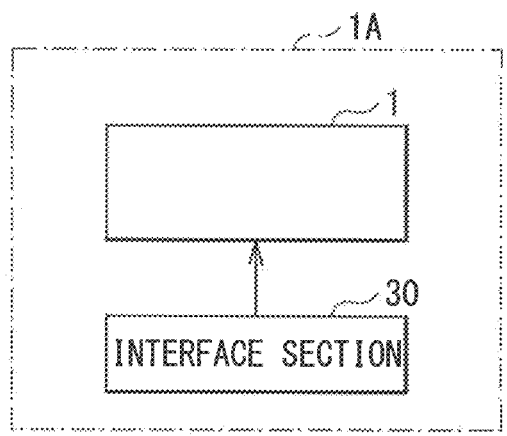
FIG. 11 is a block diagram illustrating a configuration of an electronic apparatus according to an application example.

The display unit 1 described in the foregoing embodiment may be applied to various types of electronic apparatuses. FIG. 11 illustrates a functional block configuration of an electronic apparatus (an electric apparatus 1A) to which the display unit 1 is applied. Non-limiting examples of the electronic apparatus 1A may include a television, a personal computer (PC), a smartphone, a tablet PC, a mobile phone, a digital still camera, and a digital video camera.

The electronic apparatus 1A may include, for example, the above-described display unit 1 and an interface section 30. The interface section 30 may be an input section that receives various signals and a power supply, for example, from an external device. The interface section 30 may include a user interface such as a touch panel, a keyboard, and operation buttons, for example.

Although the description has been given hereinabove with reference to the embodiment and the application example, the disclosure is not limited thereto, but may be modified in a wide variety of ways. For example, the foregoing embodiment, etc. has exemplified the case where the pixel separation film 14 may be configured by a stacked structure of the first insulating film 14A and the second insulating film 14B, and where these first insulating film 14A and second insulating film 14B may be formed in different processes. However, the configuration of the pixel separation film 14 is not limited thereto. For example, the second insulating film 14B may not necessarily be provided insofar as a region between pixel columns (i.e., between pixels of different light emission colors) allows for sufficient separation.

Figure 12:
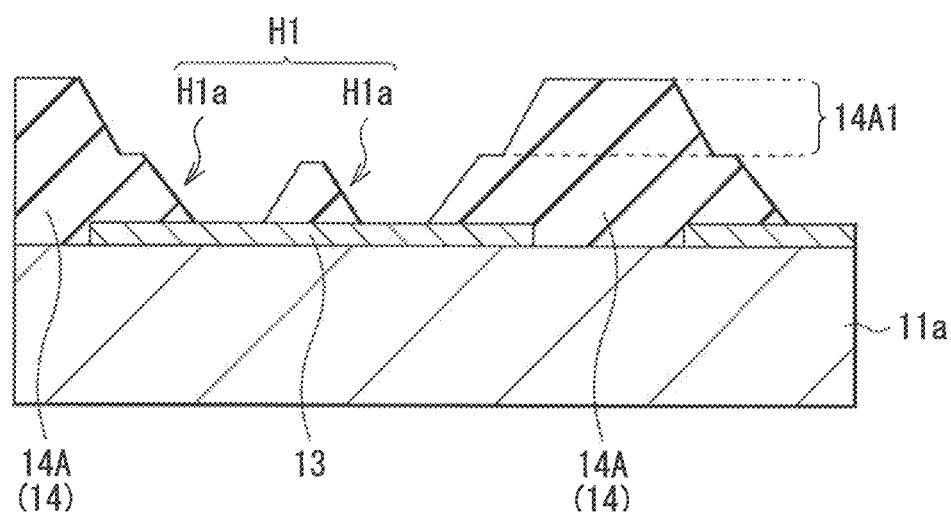
FIG. 12 is a cross-sectional view of another configuration example of the pixel separation film (first insulating film).

Further, the first insulating film 14A and the second insulating film 14B may be formed integrally (as a single-layer film). In other words, the first insulating film 14A may include a part that corresponds to the second insulating film 14B (i.e., the first insulating film 14A may include a structure that serves also as the second insulating film 14B). For example, as illustrated in FIG. 12, the first insulating film 14A may serve as the pixel separation film 14 of the foregoing embodiment, and may include the opening H1 (the sub-opening H1a) and the recess H2 (unillustrated in FIG. 12). In addition, the first insulating film 14A may include a projection 14A1 in a region between the pixels P of different light emission colors. The projection 14A1 may have a planar configuration similar to that of the second insulating film 14B illustrated in FIG. 5A. Also in this case, it is desirable that a selective part corresponding to the projection 14A1 have the liquid-repellent property.

Furthermore, in the foregoing embodiment, etc., the sub-opening H1a formed in the first insulating film 14A may have a rectangular shape. However, the shape of each of the opening H1 and the sub-opening H1a is not limited to the rectangular shape. In addition to the rectangular shape, various shapes such as a circular shape, an elliptical shape, and a polygonal shape may also be adopted. Also, the number of the sub-opening H1a is not limited to two, but may be one or three or more. In a case where one opening H1 includes a plurality of sub-openings H1a, the plurality of sub-openings H1a may be either the same as or different from one another in their shapes. Layouts, such as shape, position, and number, of the opening and the sub-opening are not particularly limited. It is sufficient to achieve a configuration in which openings (sub-openings) are connected together via the recess H2.

In addition, factors such as a material and a thickness of each layer, and a film-forming method as well as a film-forming condition exemplified in the foregoing embodiment, etc. are not limitative. Any other material, any other thickness, any other film-forming method, and any other film-forming condition may be adopted besides those described above.

Further, in the foregoing embodiment, etc., description has been given with reference to the specific configuration of the organic EL element 10; however, it is not necessary to provide all the layers, and any other layer may be further provided.

Furthermore, in the foregoing embodiment, etc., description has been given of the case of the active matrix display unit; however, the disclosure may also be applied to a passive matrix display unit. Moreover, the configuration of the pixel circuit PXLC for active matrix driving is not limited to that described in the foregoing embodiment; a capacitor element or a transistor may also be added as necessary. In this case, a necessary drive circuit may also be added, in addition to the scanning line driver 3, the signal line driver 4, and the power line driver 5, depending on alteration of the pixel circuit PXLC.

Note that the effects described herein are mere examples. The effect of the disclosure is not limited thereto, and may include other effects.

Moreover, the disclosure may also have the following configurations.

(1)

A display unit provided with a plurality of pixels that are two-dimensionally arranged and each include an organic electroluminescence element emitting light of one of a plurality of colors,
  the pixels being arranged along one direction for each of light emission colors, and
  the pixels each including:
    a first insulating film having openings for the respective pixels;
    a second insulating film extending along the arrangement direction for each of the light emission colors, in a region between pixels of different light emission colors, out of the plurality of pixels, on the first insulating film; and
    an organic layer formed in each of the openings and including a light-emitting layer,
  the first insulating film including a recess that connects together the openings of pixels of the same light emission color, out of the plurality of pixels.

(2)

The display unit according to (1), in which a contact angle on a surface of the recess is smaller than a contact angle on an upper surface of the second insulating film.

(3)

The display unit according to (1) or (2), in which a taper angle of a side surface of the recess is smaller than a taper angle of a side surface of each of the openings.

(4)

The display unit according to any one of (1) to (3), in which the recess is formed in a region between pixels that are adjacent in the arrangement direction for each of the light emission colors.

(5)

The display unit according to any one of (1) to (4), in which the second insulating film has a liquid-repellent property.

(6)

The display unit according to any one of (1) to (5), in which
the first insulating film and the second insulating film are integrally provided, and
the second insulating film constitutes a projection on the first insulating film.

(7)

The display unit according to (6), in which a selective part, of the first insulating film, corresponding to the projection has a liquid-repellent property.

(8)

The display unit according to any one of (1) to (7), in which the first insulating film has a thickness in a bottom of the recess.

(9)

The display unit according to any one of (1) to (8), in which
the openings each include a plurality of sub-openings, and
the plurality of sub-openings are each provided to extend along the arrangement direction.

(10)

The display unit according to any one of (1) to (9), in which the openings each include a reflector.

(11)

An electronic apparatus including a display unit,
the display unit provided with a plurality of pixels that are two-dimensionally arranged and each include an organic electroluminescence element emitting light of one of a plurality of colors,
the pixels being arranged along one direction for each of light emission colors, and
the pixels each including
a first insulating film having openings for the respective pixels,
a second insulating film extending along the arrangement direction for each of the light emission colors, in a region between pixels of different light emission colors, out of the plurality of pixels, on the first insulating film, and
an organic layer formed in each of the openings and including a light-emitting layer,
the first insulating film including a recess that connects together the openings of pixels of the same light emission color, out of the plurality of pixels.

(12)

An electronic apparatus including a display unit,
the display unit provided with a plurality of pixels that are two-dimensionally arranged and each include a light-emitting element emitting light of one of a plurality of colors,
the pixels being arranged along one direction for each of light emission colors, and
the pixels each including
a first insulating film having openings for the respective pixels,
a second insulating film extending along the arrangement direction for each of the light emission colors, in a region between pixels of different light emission colors, out of the plurality of pixels, on the first insulating film, and
a light-emitting layer formed in each of the openings,
the first insulating film including a recess that connects together the openings of pixels of same light emission color, out of the plurality of pixels.

This application claims the benefit of Japanese Priority Patent Application JP2016-107097 filed with the Japan Patent Office on May 30, 2016, the entire contents of which are incorporated herein by reference.

It should be understood by those skilled in the art that various modifications, combinations, sub-combinations, and alterations may occur in accordance with design requirements and other factors insofar as they are within the scope of the appended claims or the equivalents thereof.

The invention claimed is:

1. A display unit provided with a plurality of pixels that are two-dimensionally arranged and each include an organic electroluminescence element emitting light of one of a plurality of colors,
the pixels being arranged along one direction for each of light emission colors, and
the pixels each comprising:
a first insulating film having openings for the respective pixels;
a second insulating film extending along the one direction for each of the light emission colors, in a region between pixels of different light emission colors, out of the plurality of pixels, on the first insulating film; and
an organic layer formed in each of the openings and including a light-emitting layer,
the first insulating film including a recess that connects together the openings of pixels of same light emission color, out of the plurality of pixels, wherein
the recess includes a side surface tapered with respect to a cross direction, perpendicular to the one direction and parallel to a top-most surface of the first insulating film, to define a first taper angle,
said each of the openings includes a side surface tapered with respect to the cross direction to define a second taper angle, and
the first taper angle of the side surface of the recess is smaller than the second taper angle of the side surface of said each of the openings.

2. The display unit according to claim 1, wherein a contact angle on a surface of the recess is smaller than a contact angle on an upper surface of the second insulating film.

3. The display unit according to claim 1, wherein the recess is formed in a region between pixels that are adjacent in the one direction for each of the light emission colors.

4. The display unit according to claim 1, wherein the second insulating film has a liquid-repellent property.

5. The display unit according to claim 1, wherein the first insulating film and the second insulating film are integrally provided, and the second insulating film constitutes a projection on the first insulating film.

6. The display unit according to claim 5, wherein a selective part, of the first insulating film, corresponding to the projection has a liquid-repellent property.

7. The display unit according to claim 1, wherein the first insulating film has a thickness in a bottom of the recess.

8. The display unit according to claim 1, wherein the openings each include a plurality of sub-openings, and the plurality of sub-openings are each provided to extend along the one direction.

9. The display unit according to claim 1, wherein the openings each include a reflector.

10. The display unit according to claim 1, wherein the recess has a width, in the cross direction crossing the one direction, greater than that of each of the openings.

11. The display unit according to claim 1, further comprising:
a plurality of recesses including the recess, wherein
said each of the openings of the pixels of same light emission color includes a plurality of sub-openings adjacent to each other in the cross direction and extending along the one direction between adjacent recesses of the plurality of recesses.

12. An electronic apparatus comprising a display unit,
the display unit provided with a plurality of pixels that are two-dimensionally arranged and each include an organic electroluminescence element emitting light of one of a plurality of colors,
the pixels being arranged along one direction for each of light emission colors, and
the pixels each including
a first insulating film having openings for the respective pixels,
a second insulating film extending along the one direction for each of the light emission colors, in a region between pixels of different light emission colors, out of the plurality of pixels, on the first insulating film, and
an organic layer formed in each of the openings and including a light-emitting layer,
the first insulating film including a recess that connects together the openings of pixels of same light emission color, out of the plurality of pixels, wherein
the recess includes a side surface tapered with respect to a cross direction, perpendicular to the one direction and parallel to a top-most surface of the first insulating film, to define a first taper angle,
said each of the openings includes a side surface tapered with respect to the cross direction to define a second taper angle, and
the first taper angle of the side surface of the recess is smaller than the second taper angle of the side surface of said each of the openings.

13. An electronic apparatus comprising a display unit,
the display unit provided with a plurality of pixels that are two-dimensionally arranged and each include a light-emitting element emitting light of one of a plurality of colors,
the pixels being arranged along one direction for each of light emission colors, and
the pixels each including
a first insulating film having openings for the respective pixels,
a second insulating film extending along the one direction for each of the light emission colors, in a region between pixels of different light emission colors, out of the plurality of pixels, on the first insulating film, and
a light-emitting layer formed in each of the openings,
the first insulating film including a recess that connects together the openings of pixels of same light emission color, out of the plurality of pixels, wherein
the recess includes a side surface tapered with respect to a cross direction, perpendicular to the one direction and parallel to a top-most surface of the first insulating film, to define a first taper angle,
said each of the openings includes a side surface tapered with respect to the cross direction to define a second taper angle, and
the first taper angle of the side surface of the recess is smaller than the second taper angle of the side surface of each of the openings.

14. The electronic apparatus according to claim 12, wherein the recess has a width, in the cross direction crossing the one direction, greater than that of each of the openings.

15. The electronic apparatus according to claim 13, further comprising:
a plurality of recesses including the recess, wherein
said each of the openings of the pixels of same light emission color includes a plurality of sub-openings adjacent to each other in the cross direction and extending along the one direction between adjacent recesses of the plurality of recesses.

* * * * *